United States Patent [19]

Embrey et al.

[11] Patent Number: 4,572,987
[45] Date of Patent: Feb. 25, 1986

[54] LAMP MONITORING CIRCUIT

[75] Inventors: Derek M. Embrey, Cardiff, Wales; Stuart F. Webb, Wokingham; Graham J. Legg, Camberley, both of England

[73] Assignee: AB Electronic Components Limited, England

[21] Appl. No.: 586,921

[22] Filed: Mar. 7, 1984

[30] Foreign Application Priority Data

Mar. 11, 1983 [GB] United Kingdom ................ 8306756

[51] Int. Cl.$^4$ ............................................. H01J 1/60
[52] U.S. Cl. ...................................... 315/77; 315/82; 315/88; 315/134; 315/135
[58] Field of Search ................ 340/641; 315/129, 135, 315/88, 77, 82, 134

[56] References Cited

U.S. PATENT DOCUMENTS 2,197,700  4/1940  MacGregor ........................ 340/641
3,883,777  5/1975  Morita ................................... 315/88
4,190,830  2/1980  Bell ..................................... 315/135
4,222,047  9/1980  Finnegan ............................ 315/135

FOREIGN PATENT DOCUMENTS 946362  1/1964  United Kingdom .

Primary Examiner—Harold Dixon
Attorney, Agent, or Firm—Pollock, Vande Sande & Priddy

[57] ABSTRACT

In order to provide a lamp failure warning in both illuminated and unilluminated states of the lamp, there is provided a resistance bridge circuit Rs, L, R2 and R3 which is substantially in balance if the lamp L is sound. An amplifier IC1 acts as a detection means if the bridge goes out of balance as a consequence of failure of the lamp L. In the unilluminated state a reduced current is fed to the bridge via a high value resistance R1, which is by-passed by a lamp switch SW1 if the lamp is to receive enough power to illuminate it.

8 Claims, 3 Drawing Figures

LAMP MONITORING CIRCUIT

This invention relates to lamp monitoring circuits, particularly for motor vehicles.

It is frequently not possible for a driver to known if a lamp has failed since the brightness of the light is insufficient for the difference in illumination to be detected from the drivers seat. This is particularly so in the case of side lights and rear lights.

Failure of a lamp such as a side light or a rear lamp can be potentially dangerous both to the driver and occupants of the vehicle and to other road users, and to drive with a failed mandatory light is illegal.

Systems have been designed that will warn the driver that there is a defective lamp when an attempt is made to switch the light on. These are the so called "hot" sensing systems.

However, notice of failure only when a lamp has to be used is not wholly saticfactory, since, even if a spare bulb is available, the need for immediate replacement may be inconvenient.

It is much more convenient if the driver can be made aware of a lamp failure at any time, whether the lamps are unilluminated, i.e. cold, or illuminated, i.e. hot.

SUMMARY OF THE INVENTION

In accordance with a first aspect of the invention, there is provided a lamp monitoring circuit comprising a resistance bridge circuit including the lamp in one arm of the bridge circuit and fixed resistances as the other arms, and detecting means across the bridge, the bridge circuit being connected across a d.c. supply through a highly value resistance to limit the current in the unilluminated state, which high value resistance has a lamp switch connected across it to apply full supply voltage to the bridge in the illuminated state, the bridge being arranged to be sufficiently balanced, when the lamp is fully operable, in both illuminated and unilluminated states, so that the detecting means across the bridge is not caused to deliver an output, but so that failure of the lamp will throw the bridge so far out of balance that the detecting means will give an output.

In order to reduce the power loss and heat dissipation requirements when passing a current through the lamp in the unilluminated state, it is preferred that the said reduced current be applied in pulses, conveniently in synchronism with power pulses to the detection means.

It is also preferable, in order to reduce the values of the resistances in series with the lamp, and hence the voltage drop to the illuminated lamp, if part of the arm of the resistance bridge in series with the lamp in the illuminated state is transferred to the other arm connected to the power supply in the illuminated state.

In accordance with a second aspect of the invention, there is provided a lamp monitoring circuit comprising a resistance bridge circuit including the lamp in one arm of the bridge circuit and fixed resistances as the other arms, and detecting means across the bridge, the bridge circuit being arranged to carry a current when the lamp is illuminated and a reduced current when the lamp is unilluminated and being arranged to be sufficiently balanced, when the lamp is fully operable, in both illuminated and unilluminated states, so that the detecting means across the bridge is not caused to deliver an output, but so that failure of the lamp will throw the bridge so far out of balance that the detecting means will give an output, in which part of an arm of the resistance bridge in series with the lamp in the unilluminated state is transferred to the other arm connected to the power supply in the illuminated state.

The invention will be further described with reference to the accompanying drawings.

DESCRIPTION OF THE PREFERRED EMBODIMENT

It is well known that if a resistance R is connected in series with a lamp, that when the lamp is caused to pass current a voltage will appear across the said resistance according to Ohm's Law. This voltage can be amplied by means of an amplifier and used to give an indication of the soundness of the lamp. This system will only give an indication when the lamp is "ON", the so-called "hot" state.

Figure 1:
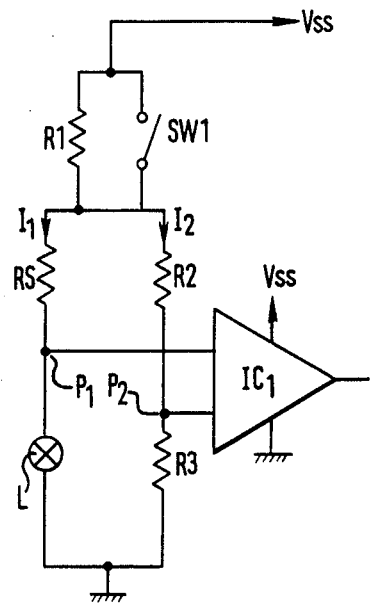
FIG. 1 is a circuit diagram of a basic form of the invention.

Additional circuitry can be provided which will enable the driver to be warned of a lamp failure even when the lamp is switched off, the so-called "cold" state. This is shown in basic form in FIG. 1.

The components, lamp L and resistors Rs, R2, and R3 form together a resistance bridge. The resistance of the lamp will be denoted by RL. An amplifier IC1 is connected such that its input terminals are supplied by the null points of the bridge. The integrated amplifier IC1 includes a balanced pair of transistors associated with the bridge circuit to provide a switching action. The bridge circuit is energized either directly via the lamp switch SW1, when the circuit is in the "hot" state, or via a high value resistor R1, when the circuit is in the "cold" state. In normal operation with a sound lamp L and with the lamp switch SW1 "on", the bridge potentials are such that:

I1.Rs is equal or nearly equal to I2.R2
and similarly:
I1.RL is equal or nearly equal to I2.R3,
where I1 and I2 are the currents in the two arms of the bridge as shown in the drawing.

Failure of the lamp L causes RL to become infinite, so that I1 becomes zero and point P1 rises to fully supply potential Vss, whilst point P2 remains at a potential equal to:

$$\frac{Vss \cdot R3}{R2 + R3}$$

This potential difference between P1 and P2 will cause amplifier IC1 to produce an output which can be used to signify a failure of the lamp L.

The system will also operate when the lamp switch is in the "OFF" state since a reduced current to energise the bridge will be drawn through resistor R1. Although the values for I1 and I2 will be lower, the general equations shown above will still be valid and a failure of a lamp will be indicated even though it is not illuminated. The difference in RL between the hot and cold states may be accommodated by the tolerances in the system, particularly by only making the amplifier IC1 sensitive to substantial potential differences between P1 and P2 and suitable choice of the values of Rs, R2 and R3.

The bridge feed current during the cold state will be determined by the value of R1 and some power loss proportional to I1².R1 will occur. If the current is drawn via a switched contact on the vehicle ignition or master switch which is open when the vehicle system is switched off, then the power loss will be reduced.

Figure 2:
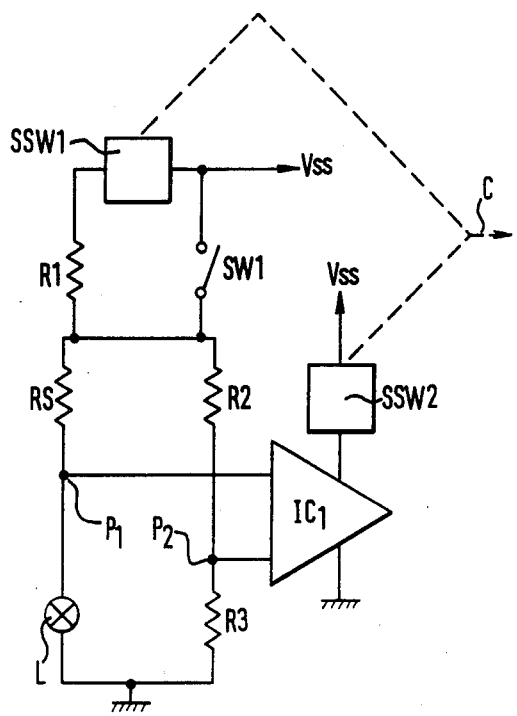
FIG. 2 is a circuit diagram of a modified version of the invention.

The power loss, and the resultant heating, of the bridge systems can be further reduced by synchronously switching a current pulse through R1 and its associated circuit and switching the sensing amplifier IC1 on. An arrangement can be made to integrate the pulse information occurring at the output of IC1 so as to minimise the flicker or strobe effect. FIG. 2 shows a typical arrangement, with synchronous switches SSW1 and SSW2 operated by clock pulses supplied on a line C.

When the system is applied to monitor lamps of high wattage, for example headlight lamps, the Ohmic value of R1 is low, and Rs must also be low so as to avoid an unacceptable voltage drop during normal operation of the lamp. The effect of this would be to produce an unacceptable heat dissipation requirement in the dropper resistance R1 during the cold state.

Figure 3:
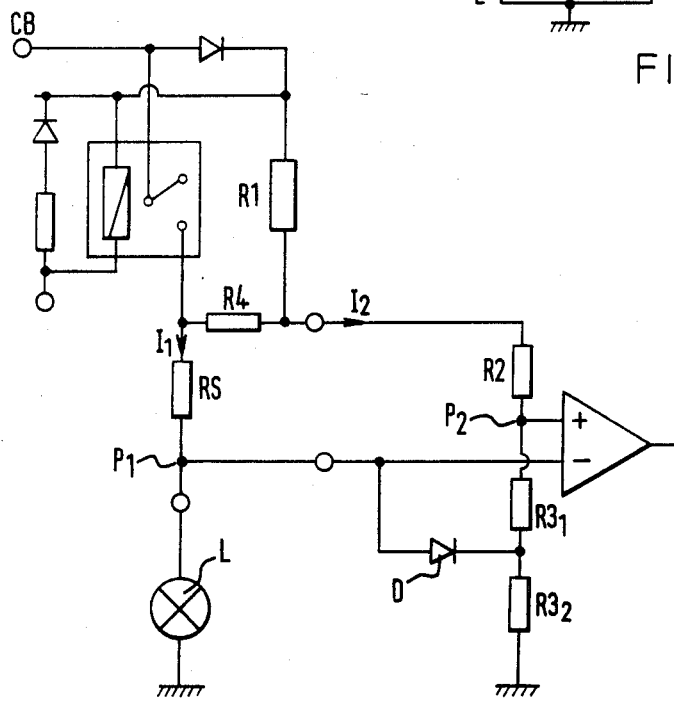
FIG. 3 is a circuit diagram of a further modified form of the invention.

This disadvantage can be overcome if a circuit configuration as shown in FIG. 3 is used. In this arrangement, an additional resistance R4, lower than R1, is introduced so as to be on opposite sides of the bridge in the hot and cold states. R3 is shown as split into R31 and R32. Here the bridge balance equation in the hot state is:

$$\frac{Rs}{RL} = \frac{R2 + R4 \cdot R1/(R1 + R4)}{R31R32}$$

If R4 is small relative to R1, this is similar to that previously described. However in the cold state the bridge balance equation becomes:

$$\frac{R4 + Rs}{RL} = \frac{R2}{R31 + R32}$$

with the bridge circuit being fed via R1. Since the shunt resistor Rs is supplemented by the series addition of R4, this bridge can have a higher ohmic value and correspondingly I1 will be lower hence I1².R1 will also be lower.

It will be appreciated that changing from the cold state to the hot state effectively alters the electrical position of R4. The lamp resistance RL in the hot state will be five to fourteen times the cold resistance. The lower multiple applies to low wattage tungsten lamps, while the higher multiple applies to high power quartz halogen lamps. Because of this, when the lamp circuit is switched on, the potential at the junction P1, which is Rs/(RL+Rs) will be very close to the supply potential, while the potential P2 applied to the opposite pole of the amplifier will be much more constant, being equal to:

$$\frac{R31 + R32}{R1 \cdot R4/(R1 + R4) + R2 + R31 + R32}$$

If R4 is much lower in value than R1 then the potential at P2 in the hot state effectively simplifies to:

$$\frac{R31 + R32}{R4 + R2 + R31 + R32}$$

and the bridge will be more nearly balanced.

FIG. 3 shows a diode D which is normally non-conductive, but which has a protective function.

If the lamp L is "ON" and in sound condition, and then fails to an open circuit condition, then the potential at the junction P1 will rise to a value very near to supply potential Vss.

The potential on the opposite pole of the amplifier will be less according to the ratio of the resistances. Under these conditions the diode D will conduct, raising the potential across R32 and reducing the differential potential applied to the amplifier. Under normal operating conditions the diode D does not conduct and can be disregarded. The diode D provides some degree of protection to the amplifier.

Various modifications may be made within the scope of the invention.

We claim:

1. In a lamp monitoring circuit comprising a resistance bridge circuit including the lamp in one arm of the bridge circuit and fixed resistors as the other arms, and detecting means across the bridge: the improvement that the bridge circuit is connected across a d.c. voltage supply through a high value resistance to limit the current when said lamp is in the unilluminated state, said high value resistor having a lamp switch connected across it to apply fully supply voltage to the bridge when said lamp is in the illuminated state, the bridge being substantially balanced, when the lamp is fully operable, in both illuminted and unilluminated states, whereby the detecting means across the bridge does not deliver an output signal until a failure of the lamp substantially unbalances said bridge, said bridge having a fixed resistor which is switched between an arm containing said lamp and the remaining arm when said lamp is changed from the unilluminated state to the illuminated state.

2. A lamp monitoring circuit as claimed in claim 1, in which the reduced current is supplied in pulses.

3. A lamp monitoring circuit as claimed in claim 2, in which the detecting means is supplied with operating power in pulses synchronous with the pulses of the reduced current.

4. In a lamp monitoring circuit comprising a resistance bridge circuit including the lamp as one arm of the bridge circuit and fixed resistors as the other arms, and detecting means across the bridge: the improvement wherein the bridge circuit carries a current when the lamp is illuminated and a reduced current when the lamp is unilluminated, said bridge being substantially balanced when the lamp is fully operable in both illuminated and unilluminated states, whereby the detecting means across the bridge does not deliver an output signal until a failure of the lamp substantially unbalances the bridge, said monitoring circuit further comprising a fixed resistor located in an arm of the resistance bridge in series with the lamp in the unilluminated state which is transferred to supply current to the other arm from a power supply when said lamp is illuminated.

5. A lamp monitoring circuit as claimed in claim 4, in which the reduced current is supplied in pulses.

6. A lamp monitoring circuit as claimed in claim 5, in which the detecting means is supplied with power in pulses synchronous with the pulses of the reduced current.

7. A lamp monitoring circuit comprising:
   a bridge circuit including a first arm of first and second resistors serially connected at a first junction, and a second arm including a third resistor serially connected at a second junction with said lamp;

a detecting means connected to measure a voltage imbalance between the first and second junctions;

a fourth resistor connecting one end of each arm, the remaining ends of said arms being connected together;

a first current path connected to said first arm one end for supplying a current to said first arm, and a current to said second arm through said fourth resistor insufficient to illuminate said lamp; and, a second switchable current path for supplying an illuminating current for said lamp to said second arm one end;

said resistor being selected to provide a substantially balanced voltage between said first and second junctions in the presence or absence of said illuminating current until said lamp fails.

8. The lamp monitoring circuit of claim 7 wherein said first arm second resistor comprises two resistors serially connected, the serial connection of said resistors being further connected by diode means to said second arm second junction.

* * * * *